United States Patent
Choi et al.

(10) Patent No.: US 9,281,347 B2
(45) Date of Patent: Mar. 8, 2016

(54) DISPLAY DEVICE INTEGRATED WITH TOUCH SCREEN PANEL

(71) Applicant: SAMSUNG DISPLAY CO., LTD., Yongin, Gyeonggi-Do (KR)

(72) Inventors: Chung-Sock Choi, Yongin (KR); Jin-Koo Kang, Yongin (KR); Soo-Youn Kim, Yongin (KR); Seung-Hun Kim, Yongin (KR); Hyun-Ho Kim, Yongin (KR); Seung-Yong Song, Yongin (KR); Cheol Jang, Yongin (KR); Sang-Hwan Cho, Yongin (KR); Sang-Hyun Park, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/520,873

(22) Filed: Oct. 22, 2014

(65) Prior Publication Data

US 2015/0115254 A1    Apr. 30, 2015

(30) Foreign Application Priority Data

Oct. 29, 2013  (KR) .................. 10-2013-0128904

(51) Int. Cl.
| | |
|---|---|
| H01L 27/32 | (2006.01) |
| H01L 51/52 | (2006.01) |
| G06F 3/044 | (2006.01) |
| G06F 3/041 | (2006.01) |

(52) U.S. Cl.
CPC .............. *H01L 27/323* (2013.01); *G06F 3/044* (2013.01); *G06F 3/0412* (2013.01); *H01L 27/3223* (2013.01); *H01L 51/5281* (2013.01); *G06F 2203/04112* (2013.01)

(58) Field of Classification Search
CPC .............. H01L 27/323; H01L 27/3223; H01L 51/5281; G06F 3/044; G06F 3/0412; G06F 2203/04112
See application file for complete search history.

(56) References Cited

U.S. PATENT DOCUMENTS

| 6,727,566 | B1 * | 4/2004 | Fukui et al. .................... | 257/437 |
| 8,605,045 | B2 * | 12/2013 | Mamba et al. ................. | 345/173 |
| 2002/0181109 | A1 * | 12/2002 | Chu ............................. | 359/586 |
| 2007/0259161 | A1 * | 11/2007 | Kato ............................ | 428/212 |
| 2007/0285776 | A1 * | 12/2007 | Nakamura et al. ............ | 359/485 |
| 2013/0106813 | A1 * | 5/2013 | Hotelling et al. ............. | 345/207 |
| 2013/0135224 | A1 * | 5/2013 | Lee et al. ...................... | 345/173 |
| 2014/0043546 | A1 * | 2/2014 | Yamazaki et al. ............. | 349/12 |
| 2014/0117330 | A1 | 5/2014 | Cho et al. | |

(Continued)

FOREIGN PATENT DOCUMENTS

| JP | 2008032804 A | * | 2/2008 |
| KR | 10-2011-0127429 A | | 11/2011 |

(Continued)

*Primary Examiner* — Ida M Soward
(74) *Attorney, Agent, or Firm* — Lee & Morse, P.C.

(57) ABSTRACT

A display device integrated with a touch screen panel may include a display device and an anti-reflection layer. The display device may include a plurality pixels arranged therein. The anti-reflection layer may include a plurality of metal layers and a plurality of dielectric layers that are sequentially laminated on an upper surface of the display device. In the display device, one or more metal layers among the plurality of metal layers constituting the anti-reflection layer may be operated as sensing electrodes of the touch screen panel.

17 Claims, 3 Drawing Sheets

(56) References Cited

U.S. PATENT DOCUMENTS

2015/0177876 A1*  6/2015  Ishii et al. .................... 345/173
2015/0227240 A1*  8/2015  Hong et al. .................. 345/173

FOREIGN PATENT DOCUMENTS

| KR | 10-2013-0044058 A | 5/2013 |
| KR | 10-2014-0056498 | 5/2014 |

* cited by examiner

DISPLAY DEVICE INTEGRATED WITH TOUCH SCREEN PANEL

CROSS-REFERENCE TO RELATED APPLICATION

Korean Patent Application No. 10-2013-0128904 filed on Oct. 29, 2013, in the Korean Intellectual Property Office, and entitled: "DISPLAY DEVICE INTEGRATED WITH TOUCH SCREEN PANEL," is incorporated by reference herein in its entirety.

BACKGROUND

1. Field

A display device integrated with a touch screen panel is provided.

2. Description of the Related Art

A touch screen panel is an input device that allows a user's instruction to be input by selecting an instruction content displayed on a screen of an image display device or the like with a user's hand or object.

To this end, a touch screen panel may be formed on a front face of an image display device to convert a contact position into an electrical signal. The user's hand or an object may directly contact the touch screen panel at a contact position. Accordingly, the instruction content selected at the contact position may be input as an input signal to the image display device.

SUMMARY

A display device integrated with a touch screen panel is provided. The display device may include a plurality pixels arranged in the display device, and an anti-reflection layer including a plurality of metal layers and a plurality of dielectric layers, the plurality of metal layers and the plurality of dielectric layers being sequentially laminated on an upper surface of the display device. One or more metal layers among the plurality of metal layers may be sensing electrodes of the touch screen panel.

The anti-reflection layer may include alternately laminated: a first metal layer, a first dielectric layer, a second metal layer, a second dielectric layer, a third metal layer, a third dielectric layer, a fourth metal layer and a fourth dielectric layer.

The third metal layer may include a plurality of first sensing electrodes of the touch screen panel and a plurality of first dummy patterns that do not to overlap with the first sensing electrodes. The fourth metal layer may include a plurality of second sensing electrodes of the touch screen panel arranged in a direction intersecting the first sensing electrodes, and a plurality of second dummy patterns that do not overlap with the second sensing electrodes.

The first sensing electrode may include a plurality of first sensing cells arranged along a first direction, and first connection patterns electrically connecting the first sensing cells to each other. The second sensing electrode may include a plurality of second sensing cells arranged along a second direction, and second connection patterns electrically connecting the second sensing cells to each other.

Each of the first and second connection patterns may include at least one metal line.

The first sensing cells and the plurality of first dummy patterns in areas between the first sensing cells may have a regular pattern and may be close to each other. The second sensing cells and the plurality of second dummy patterns in areas between the second sensing cells may have a regular pattern and may be close to each other.

The first and second sensing electrodes may have a mesh shape that does not overlap with the plurality of pixels in the display device.

The first dummy patterns may include the same metal material as the first sensing electrodes, and may have a mesh shape that does not overlap with the pixels. The second dummy patterns may include the same metal material as the second sensing electrodes, and may have a mesh shape that does not overlap with the pixels.

The light transmittance of light emitted by the pixels in the anti-reflection layer may range from about 40% to about 80%.

The thickness of the metal layers that may be included in the anti-reflection layer may range from about 2 nm to about 20 nm.

The second sensing cells may respectively overlap with first dummy patterns corresponding thereto, and the second dummy patterns may respectively overlap with first sensing cells corresponding thereto.

The second dummy patterns may be electrically connected to the respective first sensing electrodes in areas wherein the second dummy patterns overlap with the first sensing electrodes.

The second dummy patterns and the first sensing cells corresponding thereto may be electrically connected by a via hole in a corresponding area of the third dielectric layer.

The display device may be an organic light emitting display device. The upper surface of the display device may include a thin film.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers or elements may also be present. In addition, it will also be understood that when a layer is referred to as being "between" two layers, it can be the only layer between the two layers, or one or more intervening layers may also be present. Also, when an element is referred to as being "connected to" another element, it can be directly connected to the another element or be indirectly connected to the another element with one or more intervening elements interposed therebetween. Like reference numerals refer to like elements throughout.

Figure 1:
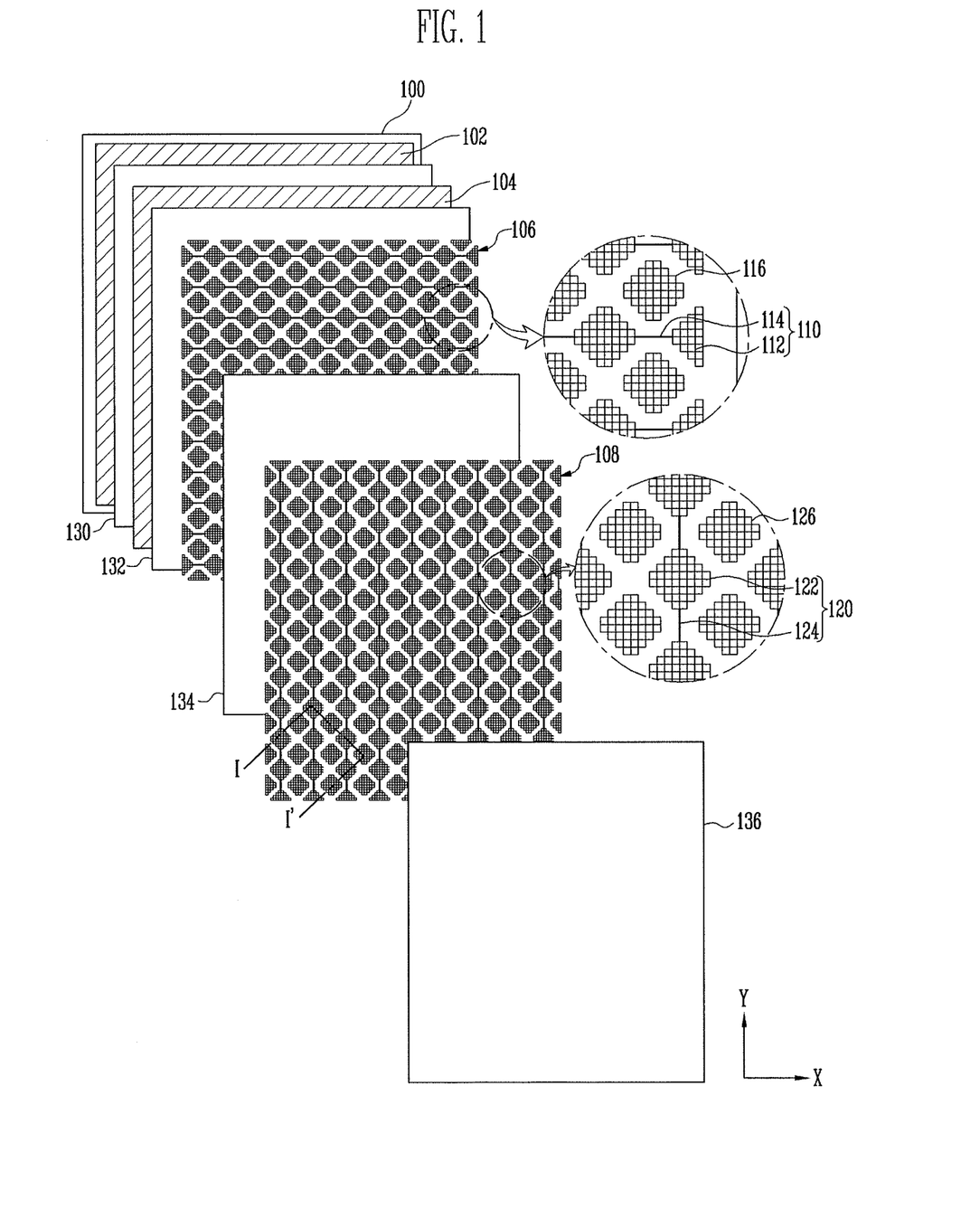
FIG. 1 illustrates a separated perspective view showing a display device integrated with a touch screen panel according to an exemplary embodiment.

FIG. 1 is a separated perspective view showing a display device integrated with a touch screen panel according to an exemplary embodiment.

The touch screen panel according to this embodiment may be directly formed on one surface of the display device.

In this case, the display device may be implemented as an organic light emitting display device, and accordingly, the touch screen panel may be directly formed on an upper surface of the organic light emitting display device.

The organic light emitting display device may include a lower substrate (not shown) on which a plurality of pixels are arranged, and an upper substrate 100 that may be configured to seal the lower substrate. The upper substrate 100 may be formed of a glass material or may be formed in the shape of a flexible thin film.

In a case where the upper substrate 100 is formed in the shape of a thin film, the thin film may be formed into a structure in which at least one organic film layer and at least one inorganic film layer are sequentially stacked.

That is, the inorganic film layer may prevent external moisture and oxygen from penetrating into an organic light emitting diode included in each pixel, and the organic film layer may reduce internal stress of the inorganic film layer or fill in a micro-crack or pin hole of the inorganic film layer.

A polarizing plate may be attached on an outer surface of the organic light emitting display device, i.e., the upper substrate 100 to improve external visibility such as blocking of external light reflection. However, the touch screen panel according to exemplary embodiments performs an anti-reflection function, and therefore, a separate polarizing plate may not be attached on the upper substrate 100 by directly forming the touch screen panel on the upper substrate 100.

Hereinafter, the configuration of the touch screen panel according an exemplary embodiment will be described in detail.

Referring to FIG. 1, a plurality of metal layers 102, 104, 106 and 108 and a plurality of dielectric layers 130, 132 and 134 may be sequentially laminated on the upper surface of the display device, i.e., the upper substrate 100 of the display device, which has a shape of a thin film and may be formed of a glass material.

In this embodiment, the reflection of external light may be prevented using destructive interference caused by a multi-layered thin film through the laminated structure of the plurality of metal layers 102, 104, 106 and 108 and the plurality of dielectric layers 130, 132 and 134, and thus a separate polarizing plate may not be attached on the upper substrate 100.

That is, the laminated structure of the plurality of metal layers 102, 104, 106 and 108 and the plurality of dielectric layers 130, 132 and 134 may perform the function of an anti-reflection layer.

Although a first metal layer 102, a first dielectric layer 130, a second metal layer 104, a second dielectric layer 132, a third metal layer 106, a third dielectric layer 134, a fourth metal layer 108, and a fourth dielectric layer 136 may be alternately laminated on the upper substrate 100, this is merely one embodiment, and exemplary embodiments are not limited thereto. For example, a dielectric layer may first be laminated on the upper substrate 100, or two or more metal or dielectric layers may be consecutively laminated on the upper substrate 100.

Although in the display device illustrated in FIG. 1, the metal layers have a four-layered structure, this is merely one embodiment, and the metal layers may have various laminated structures including a five-layered structure, a six-layered structure, or the like.

Embodiments are not limited in the forming method and material of the metal layers.

For example, the material of each of the first to fourth metal layers 102, 104, 106 and 108 may include one or more alloys including Al, Ag, Mg, Cr, Ti, Ni, Au, Ta, Cu, Ca, Co, Fe, Mo, W, Pt and Yb, but embodiments are not limited thereto.

The metal layers may be formed by a method including sputtering, chemical vapor deposition (CVD), physical vapor deposition (PVD), E-beam evaporation, thermal evaporation, thermal ion beam assisted deposition (IBAD), or the like, and embodiments are not limited thereto.

Because metal is a material that absorbs light, a portion of the light may be absorbed in the metal layer when the light is transmitted through the metal layer. That is, in case of a metal layer included in the anti-reflection layer, the reflection of external light may be reduced through extinction interference using partially reflected light. In addition, external light which is not completely destroyed through destructive interference may be absorbed when the light is transmitted through the metal layer.

The anti-reflection layer may further include dielectric layers alternately laminated with the metal layers as described above, and materials and methods of forming the dielectric layers is not limited.

For example, the material of each of the first to fourth dielectric layers 130, 132, 134 and 136 may include a compound including one or more of $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, VOX, SiNX, eNX, ZnS, CdS, SiC, SiCN, MgF, $CaF_2$, NaF, $BaF_2$, PbF2, LiF, $LaF_3$ and GaP. However, embodiments are not limited thereto.

Methods of laminating the dielectric layers may include spin coating, spray coating, screen printing, inkjet printing, dispensing or the like. However, embodiments are not limited thereto. In addition, all methods including sputtering, CVD, plasma enhanced chemical vapor deposition (PECVD), thermal evaporation, IBAD, atomic layer deposition (ALD), etc., which are currently developed and commercialized or methods that may be implemented according to technological developments in the future, may be used to form the dielectric layers.

The dielectric layer included in the anti-reflection layer may control the phase difference of light and correct the phase of light. That is, the dielectric layer may destroy external light reflected thereon, using optical destructive interference, and thereby may reduce or prevent the reflection of the external light. The optical destructive interference may refer to a phenomenon in which when lights reflected on an interface have the same reflection amplitude with a phase of about 180 degrees, and the lights are offset to each other.

That is, the anti-reflection layer may destroy external light, using the optical destructive interference and the absorption of light in the metal layer, thereby reducing the reflection of the external light. Thus, the reflection of the external light may be reduced without using any circular polariscope. Accordingly, it may be possible to decrease the thickness of the entire display device and to improve the visibility of the display device even though the thickness of the display device may be decreased.

In exemplary embodiments, some of the plurality of metal layers constituting the anti-reflection layer may be used as sensing electrodes of the touch screen panel.

In the embodiment shown in FIG. 1, the third and fourth metal layers 106 and 108 are used as sensing electrodes of the touch screen panel. To this end, the third and fourth metal layers 106 and 108 may be patterned as shown in FIG. 1.

In particular, third metal layer 106 may be patterned as a plurality of first sensing electrodes 110 in the touch screen panel, and the fourth metal layer 108 may be patterned as a plurality of second sensing electrodes 120 in the touch screen panel.

More specifically, the first sensing electrode 110 may be formed long along a first direction (e.g., an X-axis direction), so that a plurality of first sensing electrodes may be arranged along a second direction (e.g., a Y-axis direction) intersecting the first direction. The second sensing electrode 120 may be formed long along the second direction, so that a plurality of second sensing electrodes may be arranged along the first direction intersecting the second direction.

The first sensing electrode 110 may include a plurality of first sensing cells 112 arranged along the first direction, and first connection patterns 114 may be configured to electrically connect the first sensing cells 112 to each other.

Similarly, the second sensing electrode 120 may include a plurality of second sensing cells 122 arranged along the second direction, and second connection patterns 124 may be configured to electrically connect the second sensing cells 122 to each other.

In this case, the first or second sensing cell 112 or 122 may have a rhombic shape as shown in FIG. 1. However, the first or second sensing cell 112 or 122 may have various additional shapes such as a circular shape or a polygonal shape.

In this embodiment, the case where the first or second sensing cell 112 or 122 is formed in a rhombic shape is described as an example. In a case where the first or second sensing cell 112 or 122 may be formed in the rhombic shape, an empty space may occurs between adjacent first or second sensing cells 112 or 122.

Accordingly, in this embodiment, a plurality of first dummy patterns 116 may be formed in areas between the adjacent first sensing cells 112, and a plurality of second dummy patterns 126 may be formed in areas between the adjacent second sensing cells 122.

As shown in FIG. 1, the first and second dummy patterns 116 and 126 may be formed in the same shape as the first and second sensing cells 112 and 122.

In this case, the first dummy patterns 116 may not be electrically connected to each other. That is, a connection pattern may not be formed between the first dummy patterns 116, and therefore, the first dummy patterns 116 may be spaced apart from each other at a predetermined interval.

Thus, the first sensing cells 112 and the plurality of first dummy patterns 116 formed in the areas between the first sensing cells 112 may be formed in a regular pattern to be close to each other on the second dielectric layer 132.

Similarly, the second dummy patterns 126 may not be electrically connected to each other. That is, a connection pattern may not be formed between the second dummy patterns 126, and therefore, the second dummy patterns 126 may be spaced apart from each other at a predetermined interval. Thus, the second sensing cells 122 and the plurality of first dummy patterns 126 formed in the areas between the second sensing cells 122 may be formed in a regular pattern to be close to each other on the third dielectric layer 134.

As shown in FIG. 1, the second sensing cells 112 formed on the third dielectric layer 134 may be formed at positions respectively overlapped with the plurality of first dummy patterns 116 formed on the second dielectric layer 132, and the second dummy patterns 126 formed on the third dielectric layer 134 may be formed at positions respectively overlapped with the plurality of first sensing cells 112 formed on the second dielectric layer 132.

Assuming, for example, that all the first and second sensing cells 112 and 122 and the first and second dummy patterns 116 and 126 are formed in the same rhombus shape, the second dummy pattern 126 corresponding to the first sensing cell 112 may be formed to overlap with the first sensing cell 112 above the first sensing cell 112, and the second sensing cell 122 corresponding to the first dummy pattern 116 may be formed to overlap with the first dummy pattern 116 above the first dummy pattern 116.

In the touch screen panel according to exemplary embodiments, first position detecting lines (not shown) may be respectively connected to one ends of the first sensing electrodes 110, and second position detecting lines (not shown) may be respectively connected to one end of the second sensing electrodes 120.

The first and second position detecting lines may transmit a signal detected from each of the sensing electrodes 110 and 120 to an external touch driving circuit (not shown) through a pad portion (not shown). The touch driving circuit receiving the signal through the first and second position detecting lines may detect a user's touch position.

In this embodiment, the first and second sensing electrodes 110 and 120 and the first and second dummy patterns 116 and 126, as described above, may be made of an opaque metal material including one or more alloys including Al, Ag, Mg, Cr, Ti, Ni, Au, Ta, Cu, Ca, Co, Fe, Mo, W, Pt, Yb, or a combination thereof.

When indium tin oxide (ITO), which requires a high-temperature process, is used as a material for forming sensing electrodes, pixels of a display device positioned beneath an upper substrate may be damaged. However, in exemplary embodiments, a process of forming the sensing electrodes may be performed at a low temperature using a metal material subjected to low-temperature sintering, so that it may be possible to reduce or prevent pixels from being damaged.

When the first sensing electrode 110 is formed of a metal having a resistance relatively lower than that of the ITO, it may be possible to reduce RC delay.

When the ITO is applied to a flexible touch screen panel, cracks may easily occur in the flexible touch screen panel due to deficient flexibility of the ITO. However, when the opaque metal is applied to the flexible touch screen panel, the occurrence of cracks may be decreased as compared with that in the ITO. Thus, the opaque metal may be easily applied to the flexible touch screen panel.

In a case where the first and second sensing electrodes 110 and 120 may be formed of the opaque metal, light emitted in pixels 20 (see FIG. 2) may be blocked by the first and second sensing electrode 110 and 120, and therefore, the image quality and visibility of the display device may be lowered.

Figure 2:
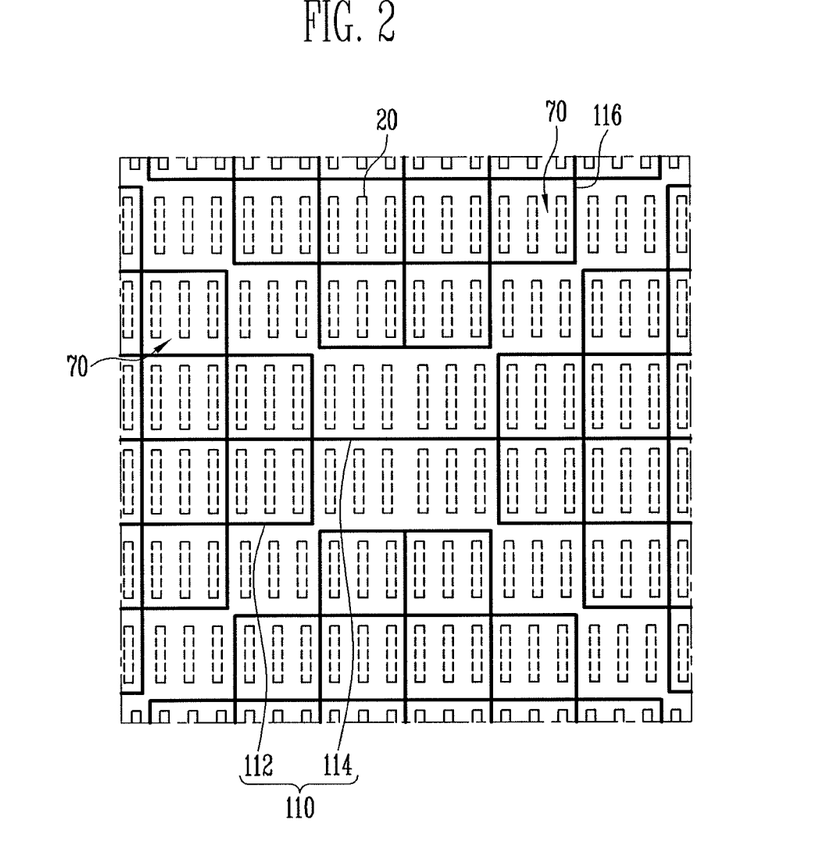
FIG. 2 illustrates a main-portion enlarged view showing first sensing electrodes and first dummy patterns shown in FIG. 1.

Accordingly, in exemplary embodiments, the first and second sensing electrodes 110 and 120 and the first and second dummy pattern 116 and 126 may be formed in a mesh shape so as not to overlap with the pixels 20 as shown in FIGS. 1 and 2.

FIG. 2 is a main-portion enlarged view showing the first sensing electrodes 110 and the first dummy patterns 116, shown in FIG. 1. In particular, a plurality of pixels 20 formed on the lower substrate of the display device, which may be positioned below the first sensing electrodes 110 and the first dummy patterns 116 are additionally shown in FIG. 2.

However, the second sensing electrodes 120 and the second dummy patterns 126 may have the same structure as the first sensing electrodes 110 and the first dummy patterns 116, except that the second sensing electrodes 120 and the second dummy pattern 126 may be arranged in a direction different from that of the first sensing electrodes 110 and the first dummy patterns 116. Therefore, their detailed descriptions is omitted.

Referring to FIG. 2, the first sensing electrode 110 may include a plurality of first sensing cells 112 arranged along the first direction, and first connection patterns 114 configured to electrically connect the first sensing cells 112 to each other.

Although it has been described in the embodiment of FIG. 2 that the first connection pattern 114 may be formed with one line, the first connection pattern 114 may also be formed with a plurality of lines. This may be provided for the purpose of adjusting the capacitance between the first sensing electrode 110 and a second sensing electrode 120 disposed to cross the first sensing electrode 110.

The second sensing electrode 120 may include a plurality of second sensing cells 122 arranged along the second direction and second connection patterns 124 configured to electrically connect the second sensing cells 122 to each other. As shown in FIG. 1, the first connection pattern 114 of the first sensing electrode 110 may cross the second connection pattern 124 of the second sensing electrode 120.

That is, capacitance may be formed between the first and second connection patterns 114 and 124 crossing each other. In this case, the capacitance may be adjusted by forming the first connection pattern 114 with one line or a plurality of lines.

As shown in FIG. 2, the first sensing cell 112 and the first dummy pattern 116 may be formed in a mesh shape through metal lines that form a plurality of openings 70 so as not to overlap with the pixels 20.

That is, the metal lines may allow the pixels 20 to be exposed through the plurality of openings 70, so that light emitted from the pixels 20 may not be blocked by the first sensing electrodes 110 and the first dummy patterns 116 but may be provided to the outside of the display device.

To this end, the first sensing electrodes 110 and the first dummy patterns 116 may be positioned to overlap with a non-emission area in which the pixels 20 do not exist.

For example, the pixels 20 may be spaced apart from each other at a predetermined distance. In this case, metal lines constituting the first sensing electrodes 110 and the first dummy patterns 116 may be positioned in the area between the pixels 20.

In order to prevent the visibility of the touch screen panel from being reduced due to the invasion of an emission area of the pixels 20 by the metal lines constituting the first sensing electrodes 110 and the first dummy patterns 116, the width of the metal line may be narrower than the distance between the pixels 20.

Although it has been illustrated in FIG. 2 that the opening 70 in the first sensing cell 110 and the first dummy pattern 116 may be formed to correspond to three pixels 20, this is merely an example. That is, the opening 70 may be formed to correspond to at least one pixel 20.

In a case where the opening 70 in the first sensing cell 110 and the first dummy pattern 116 are formed to correspond to three pixels 20, the three pixels 20 may be red, green and blue pixels.

In the embodiment shown in FIGS. 1 and 2, the first and second sensing cells 112 and 122 may be formed, for example, in a rhombic shape. However, the mesh-shaped metal lines corresponding to the third metal layer 106, which may be arranged in the area between the pixels 20, may be divided into groups in the first direction to be used as the first sensing electrodes. The mesh-shaped metal lines corresponding to the fourth metal layer 108 may be divided into groups in the second direction to be used as the second sensing electrodes.

In this case, the divided first sensing electrodes may be electrically insulated from each other. When the first sensing electrodes are formed in such a shape, the first dummy patterns may not be formed.

Similarly, the divided second sensing electrodes may be electrically insulated from each other. When the second sensing electrodes are formed in such a shape, the second dummy patterns may not be formed.

Figure 3:
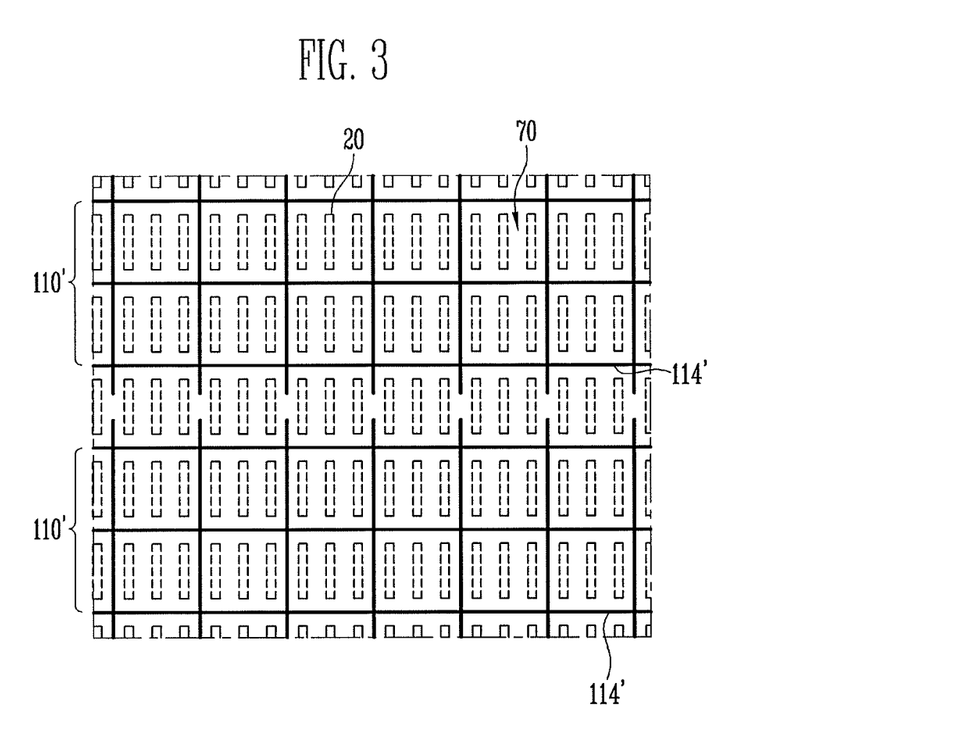
FIG. 3 illustrates a main-portion enlarged view showing first sensing electrodes according to another embodiment.

FIG. 3 is a main-portion enlarged view showing first sensing electrodes according to another embodiment. The first sensing electrodes 110' may be configured by dividing mesh-shaped metal lines 114' arranged in the first direction into groups in the first direction.

Second sensing electrodes may have the same structure as the first sensing electrodes 110', except that the second sensing electrodes may be arranged in a direction different from that of the first sensing electrodes 110'. Therefore, their detailed description is omitted.

Like the embodiment shown in FIG. 2, the mesh-shaped metal lines may allow the pixels 20 to be exposed through the plurality of openings 70, so that light emitted from the pixels 20 may not be blocked by the first sensing electrodes 110' but may be provided to the outside of the display device.

The divided first sensing electrodes 110' may be electrically insulated from each other. In a case where the first sensing electrodes 110' are formed in such a shape, the first dummy patterns of the embodiment shown in FIG. 2 may not be formed.

As shown in the embodiment of FIG. 3, each first sensing electrode 110' may include, for example, three metal lines 114' arranged in the first direction. However, the number of the metal lines 114' in the first direction, which constitute the first sensing electrode 110', is not limited.

The metal lines 114' arranged in the first direction may perform the same function of the first connection pattern 114 of the embodiment shown in FIG. 2.

The third and fourth metal layers 106 and 108 among the first to fourth metal layers 102, 104, 160 and 108 constituting the anti-reflection layer may be formed in a mesh shape as described above in order to be operated as sensing electrodes of the touch screen panel, but the first and second metal layers 102 and 104 may be formed in a surface shape other than the mesh shape.

Light emitted in the pixels 20 formed on the lower substrate of the display device may be blocked by the first and second metal layers 102 and 104. Therefore, the thickness of the first and second metal layers 102 and 104 may be formed such that light may be transmitted through the first and second metal layers 102 and 104.

For example, if the thickness of the first and second metal layers 102 and 104 are be formed to 2 to 20 nm, the transmittance of the anti-reflection layer may be about 40 to 80%. The transmittance of the anti-reflection layer may be approximately the same as or greater than that of a general polarizing plate.

Figure 4:
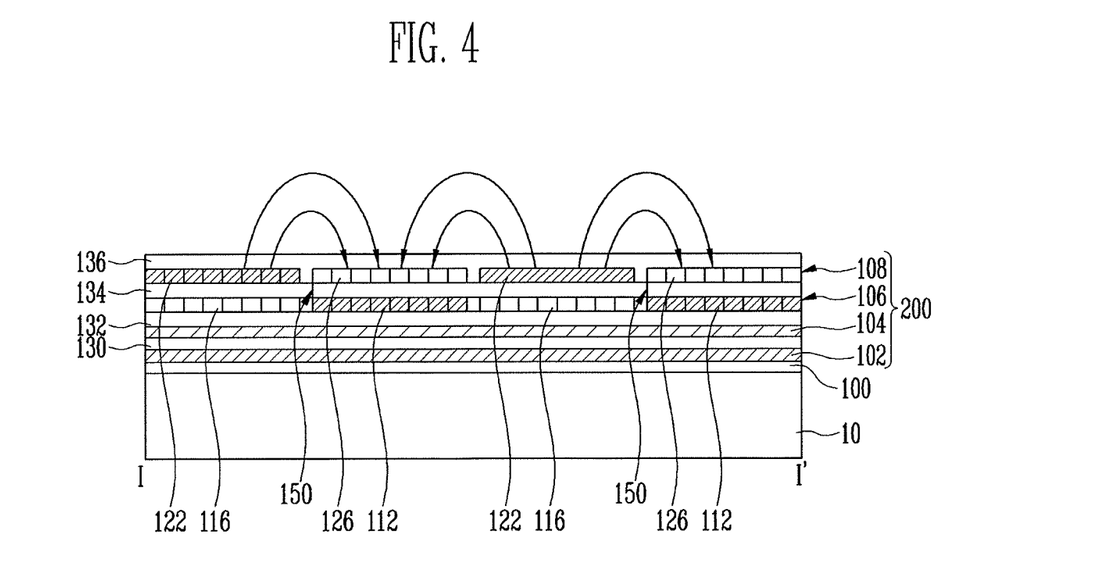
FIG. 4 illustrates a sectional view showing a region (I-I') of the display device integrated with the touch screen panel, as shown in FIG. 1.

FIG. 4 is a sectional view showing one region (I-I') of the display device integrated with the touch screen panel, shown in FIG. 1. The structure and operation of the touch screen panel according to an exemplary embodiment is described as follows.

Referring to FIGS. 1 and 4, the display device integrated with the touch screen panel may include a display device 10, and an anti-reflection layer 200 formed on an upper substrate 100 of the display device 10.

The anti-reflection layer 200 may include a structure in which a first metal layer 102, a first dielectric layer 130, a second metal layer 104, a second dielectric layer 132, a third metal layer 106, a third dielectric layer 134, a fourth metal layer 108 and a fourth dielectric layer 136 may be alternately laminated on the upper substrate 100.

Although it has been illustrated in FIG. 4 that the thickness of each layer constituting the anti-reflection layer 200 may be thick, this is only for convenience of illustration. The thickness of each layer constituting the anti-reflection layer 200 may be formed much thinner than that illustrated in FIG. 4.

The third metal layer 106 may be patterned into a plurality of first sensing electrodes 110 and a plurality of first dummy patterns 116 in the touch screen panel, and the fourth metal layer 108 may be patterned into a plurality of second sensing electrodes 120 and a plurality of second dummy patterns 126 in the touch screen panel.

The first sensing electrode 110 may include a plurality of first sensing cells 112 arranged along the first direction, and first connection patterns 114 configured to electrically connect the first sensing cells 112 to each other. The second sensing electrode 120 may include a plurality of second sensing cells 122 arranged along the second direction, and second connection patterns 124 configured to electrically connect the second sensing cells 122 to each other.

The display device 10 may be implemented as an organic light emitting display device. The organic light emitting display device may include a lower substrate (not shown) on which a plurality of pixels (20 of FIG. 2) may be arranged, and an upper substrate 100 configured to seal the lower substrate. The upper substrate 100 may be formed of a glass material or may be formed in the shape of a flexible thin film.

In a case where the upper substrate 100 is formed in the shape of a thin film, the thin film may be formed into a structure in which at least one organic film layer and at least one inorganic film layer may be sequentially stacked.

The first to fourth metal layers 102, 104, 106 and 108, formed on the upper substrate 100 may be formed of an opaque metal material.

In this case, the first sensing electrodes 110 and the dummy patterns 116, which constitute the third metal layer 106, and the second sensing electrodes 120 and the second dummy patterns 126, which constitute the fourth metal layer 108, may be formed in a mesh shape so as not to overlap with the pixels 20 as described in FIG. 2.

The first dummy patterns 116 may be formed in areas between the first sensing cells 112, and the shape of the first dummy patterns 116 may be identical to that of the first sensing cells 112. However, the first dummy patterns 116 may not be electrically connected to each other.

Similarly, the second dummy patterns 126 may be formed in areas between the second sensing cells 122, and the shape of the second dummy patterns 126 may be identical to that of the second sensing cells 122. However, the second dummy patterns 126 may not be electrically connected to each other.

As shown in FIG. 4, the second sensing cell 122 formed on the third dielectric layer 134 may be formed at a position overlapping with the first dummy pattern 116 formed on the second dielectric layer 132, and the second dummy pattern 126 formed on the third dielectric layer 134 may be formed at a position overlapping with the first sensing cell 112 formed on the second dielectric layer 132.

When, for example, all the first and second sensing cells 112 and 122 and the first and second dummy patterns 116 and 126 are formed in the same rhombus shape, the second dummy pattern 126 corresponding to the first sensing cell 112 may be formed to overlap with the first sensing cell 112 above the first sensing cell 112, and the second sensing cell 122 corresponding to the first dummy pattern 116 may be formed to overlap with the first dummy pattern 116 above the first dummy pattern 116.

The second dummy patterns 126 may be configured to be electrically connected to the respective first sensing cells 112 formed in the areas overlapped with the second dummy patterns 126. The connection between the second dummy pattern 126 and the first sensing cell 112 corresponding thereto may be performed by forming a via hole 150 in a corresponding area of the third dielectric layer 134.

The touch screen panel according to exemplary embodiments may sense a change in capacitance when the intensity of an electric field between the first sensing cell 112 and the second sensing cell 122 adjacent thereto may be changed by an object contacting the touch screen panel. In the embodiment shown in FIG. 5, the first sensing cell 112 may be electrically connected to the second dummy pattern 126 overlapping therewith, and therefore, the second dummy pattern 126 may perform the same function as the first sensing cell 112 connected thereto. Thus, the electric field between the second sensing cell 122 and the second dummy pattern 126 adjacent thereto on the same plane may be generated.

By way of summation and review, because a touch screen panel may be substituted for a separate input device connected to an image display device, such as a keyboard or mouse, its application fields have been gradually extended. Generally, such a touch screen panel may frequently be commercialized by being attached to an outer face of an image display device such as a liquid crystal display device or organic light emitting display device.

In addition, a polarizing plate may be attached to the outer surface of the image display device in order to improve external visibility by blocking the reflection of external light.

In this case, the polarizing plate and the touch screen panel may need to be separately manufactured and then attached or assembled together. This may result in an increase in the entire thickness of the touch screen panel, a decrease in process efficiency, or a decrease in yield, etc.

In contrast, in the display device integrated with the touch screen panel according to exemplary embodiments, a conductive pattern in the anti-reflection layer formed on the upper surface of the display device may be used as a sensing electrode operated as a touch sensor, and may be integrally formed, so that it may be possible to ensure flexibility, to decrease the thickness of the display device, and to improve the visibility of an image by removing the existing polarizing plates.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device integrated with a touch screen panel, the display device comprising:

a plurality pixels arranged in the display device; and an anti-reflection layer including a plurality of metal layers and a plurality of dielectric layers, the plurality of metal layers and the plurality of dielectric layers being sequentially laminated on an upper surface of the display device, wherein one or more metal layers among the plurality of metal layers of the anti-reflection layer are sensing electrodes of the touch screen panel.

2. The display device as claimed in claim 1, wherein the anti-reflection layer includes alternately laminated: a first metal layer, a first dielectric layer, a second metal layer, a second dielectric layer, a third metal layer, a third dielectric layer, a fourth metal layer and a fourth dielectric layer.

3. The display device as claimed in claim 2, wherein:
the third metal layer includes:
  a plurality of first sensing electrodes of the touch screen panel and
  a plurality of first dummy patterns that do not to overlap with the first sensing electrodes, and
the fourth metal layer includes:
  a plurality of second sensing electrodes of the touch screen panel arranged in a direction intersecting the first sensing electrodes, and
  a plurality of second dummy patterns that do not overlap with the second sensing electrodes.

4. The display device as claimed in claim 3, wherein:
each of the first sensing electrodes includes:
  a plurality of first sensing cells arranged along a first direction, and
  first connection patterns electrically connecting the first sensing cells to each other, and
each of the second sensing electrodes includes:
  a plurality of second sensing cells arranged along a second direction, and
  second connection patterns electrically connecting the second sensing cells to each other.

5. The display device as claimed in claim 4, wherein each of the first and second connection patterns includes at least one metal line.

6. The display device as claimed in claim 4, wherein the first sensing cells and the plurality of first dummy patterns in areas between the first sensing cells have a regular pattern and are close to each other.

7. The display device as claimed in claim 4, wherein the second sensing cells and the plurality of second dummy patterns in areas between the second sensing cells have a regular pattern and are close to each other.

8. The display device as claimed in claim 3, wherein the first and second sensing electrodes have a mesh shape that does not overlap with the plurality of pixels in the display device.

9. The display device as claimed in claim 3, wherein the first dummy patterns include a same metal material as the first sensing electrodes, and have a mesh shape that does not overlap with the pixels.

10. The display device as claimed in claim 3, wherein the second dummy patterns include a same metal material as the second sensing electrodes, and have a mesh shape that does not overlap with the pixels.

11. The display device as claimed in claim 1, wherein light transmittance of light emitted by the pixels in the anti-reflection layer ranges from about 40% to about 80%.

12. The display device as claimed in claim 11, wherein a thickness of the metal layers included in the anti-reflection layer ranges from about 2 nm to about 20 nm.

13. The display device as claimed in claim 4, wherein the second sensing cells respectively overlap with first dummy patterns corresponding thereto, and the second dummy patterns respectively overlap with first sensing cells corresponding thereto.

14. The display device as claimed in claim 13, wherein the second dummy patterns are electrically connected to the respective first sensing electrodes in areas wherein the second dummy patterns overlap with the first sensing electrodes.

15. The display device as claimed in claim 14, wherein the second dummy patterns and the first sensing cells corresponding thereto are electrically connected by a via hole in a corresponding area of the third dielectric layer.

16. The display device as claimed in claim 1, wherein the display device is an organic light emitting display device.

17. The display device as claimed in claim 1, wherein the upper surface of the display device includes a thin film.

* * * * *